(12) United States Patent
Lin et al.

(10) Patent No.: US 9,841,180 B1
(45) Date of Patent: Dec. 12, 2017

(54) COMBINED TYPE SINGLE STUD ILLUMINATING BUILDING BLOCK

(71) Applicant: LONGMEN GETMORE POLYURETHANE CO., LTD., Huizhou, Guangdong (CN)

(72) Inventors: Chia-Yen Lin, Huizhou (CN); Yaping Feng, Hengnan County (CN)

(73) Assignee: LONGMEN GETMORE POLYURETHANE CO., LTD., Juizhou, GuangDong (CN)

( * ) Notice: Subject to any disclaimer, the term of this patent is extended or adjusted under 35 U.S.C. 154(b) by 0 days.

(21) Appl. No.: 15/401,129

(22) Filed: Jan. 9, 2017

(30) Foreign Application Priority Data

Oct. 27, 2016 (CN) .................... 2016 2 1181877 U

(51) Int. Cl.
*F21V 33/00* (2006.01)
*H05K 1/18* (2006.01)
*F21V 15/01* (2006.01)

(52) U.S. Cl.
CPC ............ *F21V 33/008* (2013.01); *F21V 15/01* (2013.01); *H05K 1/181* (2013.01); *H05K 2201/10113* (2013.01)

(58) Field of Classification Search
CPC .... A63H 33/042; A63H 33/086; A63H 33/04; F21W 33/008; H05K 1/181; H05K 2201/10113; F21K 9/20
See application file for complete search history.

(56) References Cited

U.S. PATENT DOCUMENTS

| | | | | |
|---|---|---|---|---|
| 8,079,890 B2 * | 12/2011 | Seligman | ............. | A63H 33/042 446/118 |
| 9,457,287 B1 * | 10/2016 | Lin | ....... | A63H 33/042 |
| 2011/0021107 A1 * | 1/2011 | Nag | ..................... | A63H 33/042 446/91 |
| 2011/0141739 A1 * | 6/2011 | Ha | .......... | F21S 2/005 362/249.02 |
| 2013/0109268 A1 * | 5/2013 | Lin | ....... | A63H 33/086 446/91 |
| 2015/0072585 A1 * | 3/2015 | Lin | ....... | A63H 33/086 446/91 |
| 2016/0325200 A1 * | 11/2016 | Lu | ........ | A63H 33/086 |

* cited by examiner

*Primary Examiner* — Robert May
*Assistant Examiner* — Leah S Macchiarolo
(74) *Attorney, Agent, or Firm* — Lin & Associates Intellectual Property, Inc.

(57) ABSTRACT

A combined type single stud illuminating building block includes a circuit board, an illuminating member and an outer housing. The circuit board includes a top side and a bottom side opposite to each other. The circuit board is extended to form at least one first connection portion. The bottom side includes an electrode circuit. The illuminating member is mounted on the top side and electrically connected with the electrode circuit. The outer housing includes a connection hole to receive the circuit board and the illuminating member. The outer housing is hollow and light transmittable. The outer housing includes at least one second connection portion connected with the at least one first connection portion, respectively. Thus, the combined type single stud illuminating building block can be connected with the building block having various numbers of engaging studs to enhance degrees of freedom and variability of connection.

7 Claims, 10 Drawing Sheets

COMBINED TYPE SINGLE STUD ILLUMINATING BUILDING BLOCK

CROSS-REFERENCE TO RELATED APPLICATION

This application claims the priority of Chinese patent application No. 201621181877.6, filed on Oct. 27, 2016, which is incorporated herewith by reference.

BACKGROUND OF THE INVENTION

1. Field of the Invention

The present invention relates generally to a combined type single stud illuminating building block, and more particularly, to an illuminating building block that can be connected with an illuminating building block having various numbers of engaging studs. Therefore, it has more degrees of freedom and can increase the variability during the connection of the illuminating building blocks.

2. The Prior Arts

The conventional illuminating building block has a light transmittable housing and an illuminating member disposed in the housing. As long as the power is supplied to the illuminating building block, the light is emitted and transmitted through the housing to the surrounding environment. Generally speaking, the conventional illuminating building blocks are classified into types of illuminating building blocks having eight studs, four studs and two studs. Except the differences between the shapes and sizes, they all include a circuit board connected with a power source, elastic pieces electrically connected with the circuit board and projected out of the studs, an illuminating member electrically connected with the circuit board, and a base to keep the circuit board, elastic pieces and the illuminating member received in the housing. The base includes through holes having a number corresponding to that of the studs. Thus, the illuminating building block can be connected with other illuminating building blocks.

Here, we take the connection of three illuminating building blocks as an example. First of all, the bottom illuminating building block is connected with the power source to provide the power needed for illumination. The intermediate illuminating building block is stacked on the bottom illuminating building block. The elastic pieces of the bottom illuminating building block are extended out of the studs and electrically connected with the circuit board of the intermediate illuminating building block. Therefore, the intermediate illuminating building block can illuminate. In the same way, the elastic pieces of the intermediate illuminating building block are i-s electrically connected with the circuit board of the upper illuminating building block that is stacked on the intermediate illuminating building block. Thus, the upper illuminating building block can illuminate. The power is transmitted from bottom to top and simultaneously transmitted through the stacked illuminating building blocks, thereby making the illuminating building blocks illuminate.

However, the shapes of the conventional illuminating building blocks are usually limited to eight studs, four studs and two studs. Thus, the combination ways and variations of stacking the illuminating building blocks are limited, which reduces the fun to play the building blocks and limits the creativity.

SUMMARY OF THE INVENTION

Based on the problem mentioned above, a primary objective of the present invention is to provide a combined type single stud illuminating building block, which can be connected with illuminating building blocks having various numbers of engaging studs to enhance the degrees of freedom and the variability of connection of the illuminating building blocks and the fun during playing the game.

In order to achieve the foregoing objective, a combined type single stud illuminating building block according to the present invention includes:

a circuit board having a circuit board top side and a circuit board bottom side opposite to the circuit board top side, the circuit board including at least one first connection portion, the circuit board bottom side including an electrode circuit disposed thereon;

an illuminating member mounted on the circuit board top side and electrically connected with the electrode circuit; and an outer housing including a connection hole, the circuit board and the illuminating member being received in the connection hole, the outer housing being hollow and light transmittable, the outer housing including at least one second connection portion connected with the at least one first connection portion, respectively.

Through the foregoing technical features, the combined type single stud illuminating building block according to the present invention can illuminate by connecting with other illuminating building block. Because the combined type single stud illuminating building block has only one engaging stud, there are more degrees of freedom when connecting the building blocks. Thus, the variability and fun during playing the building blocks are enhanced. Moreover, the present invention omits the bases of the conventional building blocks.

Preferably, the outer housing includes an engaging stud. The engaging stud is located on the outer housing and extended in a direction away from the illuminating member. The engaging stud is hollow and light transmittable. More preferably, the engaging stud is formed with an emitting space, and the illuminating member is projected into the emitting space.

Preferably, the outer housing includes a cylindrical casing member and a circumferential flange. The cylindrical casing member is formed with the connection hole. The at least one second connection portion is disposed in the cylindrical casing member. The circumferential flange is disposed on the cylindrical casing member. An engaging stud is extended from the circumferential flange in a direction away from the illuminating member. The engaging stud is formed with an emitting space, and the illuminating member is disposed in the emitting space.

Preferably, the outer housing includes a decoration portion. The decoration portion is disposed on the engaging stud, and the decoration portion is light transmittable.

Preferably, the at least one first connection portion includes a plurality of first connection portions and the at least one second connection portion includes a plurality of second connection portions. The first connection portions are connected with the second connection portions, respectively.

Preferably, a periphery of the circuit board is projected outwards to form the at least one first connection portion, and each first connection portion is a fitting fixation portion. An interior wall of the outer housing facing the connection hole is formed with the at least one second connection portion and at least one placement groove having a number corresponding to that of the second connection portion. Each second connection portion is a fitting fixation groove. Each second connection portion communicates with the adjacent placement grooves, respectively. More preferably, the at least one second connection portion and the at least one placement grooves are alternately arranged.

Preferably, each second connection portion includes a blocking piece disposed therein. The at least one first connection portion is abut against the at least one blocking piece, respectively.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

Figure 1:
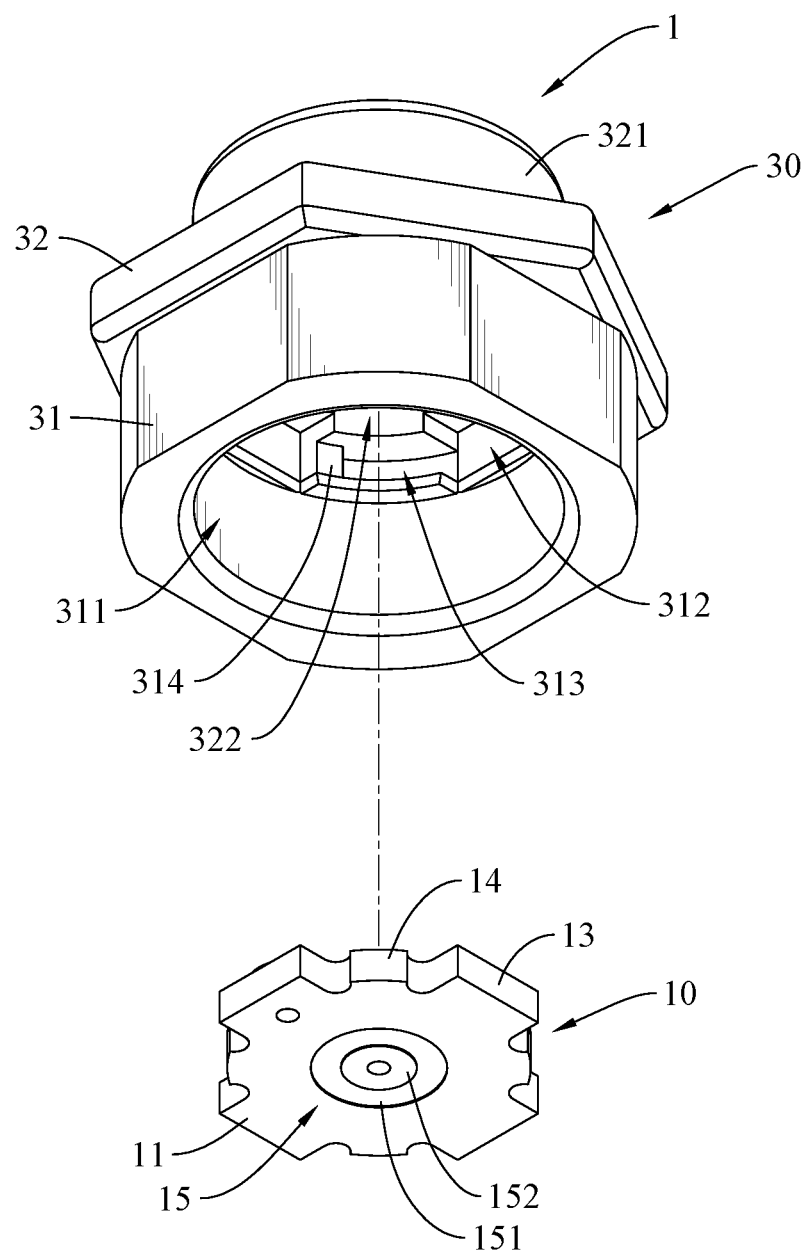
FIG. 1 is an exploded look-up view showing a combined type single stud illuminating building block according to a first preferred embodiment of the present invention.
Figure 2:
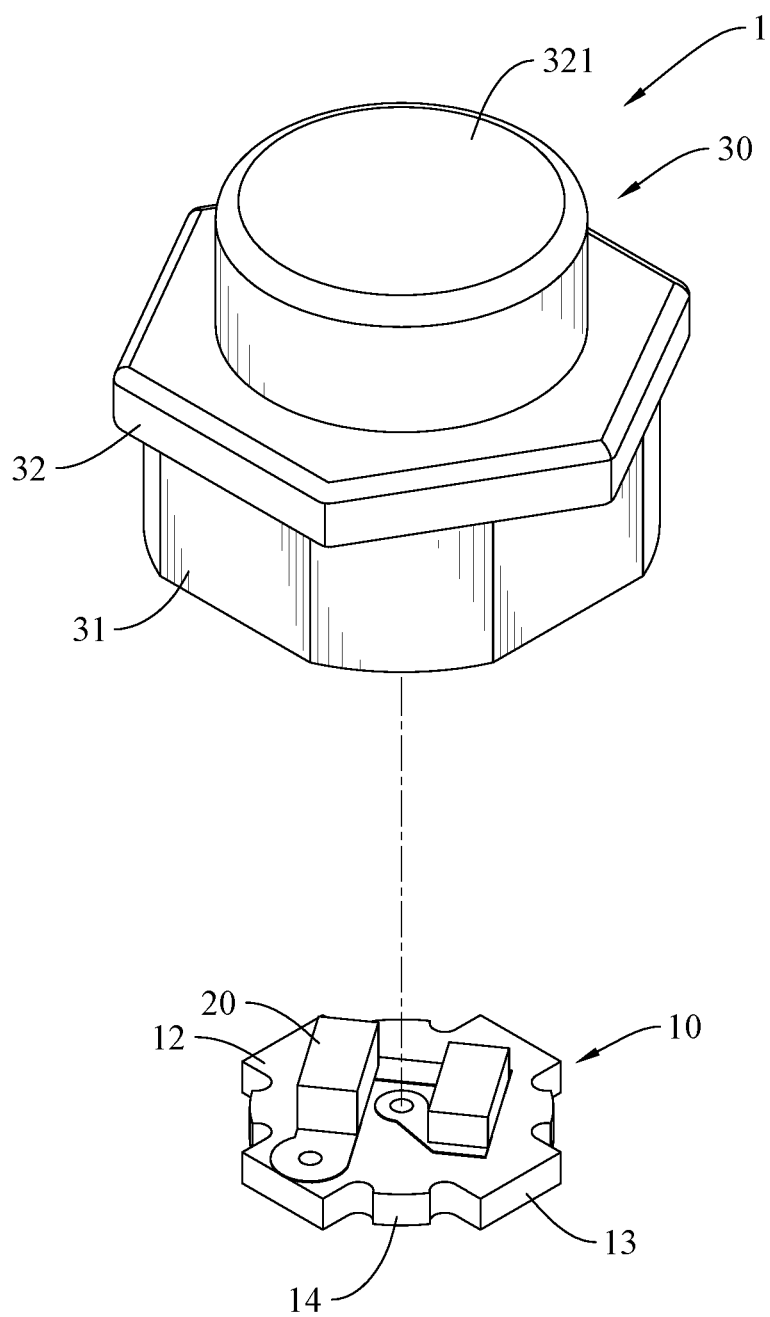
FIG. 2 is an exploded look-down view showing the combined type single stud illuminating building block according to the first preferred embodiment of the present invention.

The embodiments of the present invention are described in detail with reference to the attached drawings, and like reference numerals in the attached drawings denote like elements.

With reference to FIGS. 1 to 4, a combined type single stud illuminating building block 1 according to a first preferred embodiment of the present invention includes a circuit board 10, an illuminating member 20 and an outer housing 30.

The circuit board 10 has a structure of a plate and is a single-sided printed circuit board. The circuit board 10 includes a circuit board bottom side 11 and a circuit board top side 12 opposite to the circuit board bottom side 11. A periphery of the circuit board 10 is projected outwards to symmetrically form four first connection portions 13 and four partition portions 14 in radial directions. Particularly, each of the first connection portions 13 is a fitting fixation portion. The first connection portion 13 and the partition portion 14 are alternately disposed around the circuit board 10, and the first connection portion 13 has a length of projection longer than that of the partition portion 14. The circuit board bottom side 11 has an electrode circuit 15 formed thereon. The electrode circuit 15 includes a first electrode 151 and a second electrode 152, whose electric properties are opposite to each other. The first electrode 151 and the second electrode 152 are disposed to be concentric and do not contact with each other.

According to another embodiment, the circuit board 10 can also be a double-sided printed circuit board.

The illuminating member 20 is disposed on the circuit board top side 12 and electrically connected with the electrode circuit 15. Therefore, the illuminating member 20 can obtain the power supplied from the exterior through the electrode circuit 15 to illuminate.

The outer housing 30 is a hollow and light transmittable element, which allows the light emitted from the illuminating member 20 to pass through. The outer housing accommodates the circuit board 10 and the illuminating member 20. The outer housing 30 includes a cylindrical casing member 31 and a circumferential flange 32.

The cylindrical casing member 31 is provided with a connection hole 311 to receive the circuit board 10 and the illuminating member 20. The interior wall of the cylindrical casing member 31 facing the connection hole 311 is provided with four placement grooves 312 and four second connection portions 313, which are arranged symmetrically and alternately. Particularly, the second connection portions 313 are fitting fixation grooves. Each of the second connection portions 313 includes a blocking piece 314 disposed therein. Each of the second connection portions 313 communicates with the adjacent placement grooves 312.

The circumferential flange 32 is disposed on the cylindrical casing member 31. The circumferential flange 32 is shaped in a hexagon and extended outward in the radial directions of the cylindrical casing member 31. An engaging stud 321 is projected from the circumferential flange 32 in the direction away from the illuminating member 20. The engaging stud 321 is a hollow and light transmittable stud. The engaging stud 321 is formed with an emitting space 322. The circuit board 10 separates the connection hole 311 of the cylindrical casing member 31 from the emitting space 322 of the engaging stud 321. The illuminating member 20 is received in the emitting space 322. According to another embodiment, the circumferential flange 32 is shaped in other shapes, such as a circle and a polygon.

Figure 3:
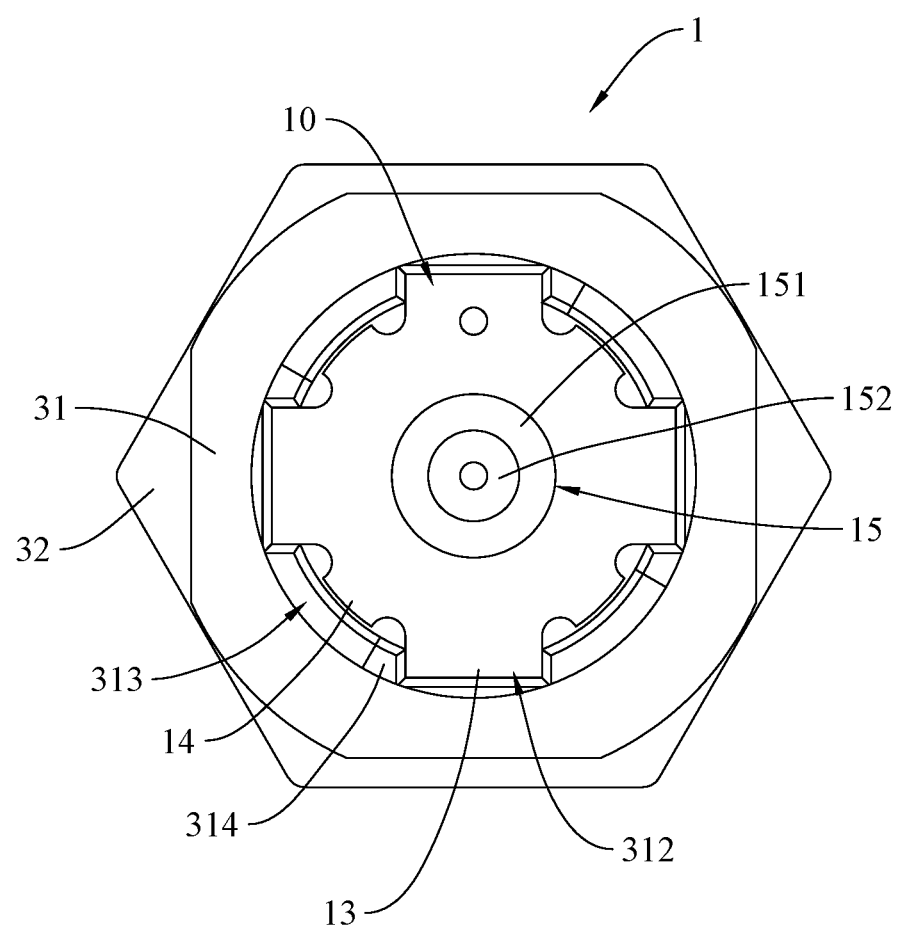
FIG. 3 is a bottom view showing the combined type single stud illuminating building block according to the first preferred embodiment of the present invention before it is assembled.
Figure 4:
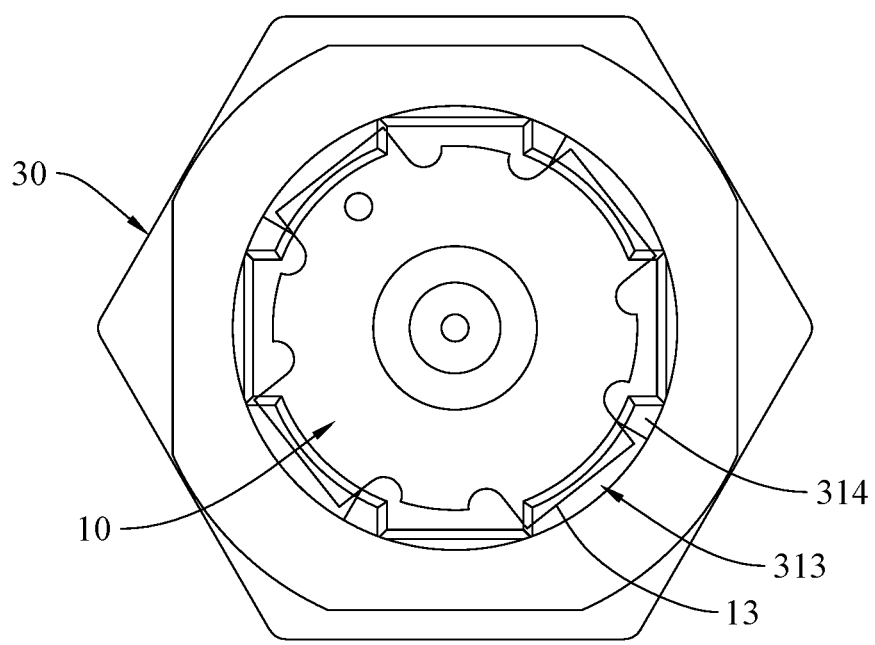
FIG. 4 is a bottom view showing the combined type single stud illuminating building block according to the first preferred embodiment of the present invention after it is assembled.

When assembling the circuit board 10 and the illuminating member 20 in the outer housing 30, first of all, the circuit board 10 is placed in the connection hole 311 to place the first connection portions 13 of the circuit board 10 into the corresponding placement grooves 312, respectively. As shown in FIG. 3, the partition portions 14 are adjacent to the second connection portions 313, respectively. Then, each of the first connection portions 13 is rotated 45 degrees in the direction towards the second connection portion 313 that communicates with the placement groove 312 where the first connection portion 13 is originally located. As shown in FIG. 4, the first connection portions 13 are received in the corresponding second connection portions 313, respectively. At this moment, the first connection portions 13 are abut against the blocking pieces 314, thereby connecting the circuit board 10 with the outer housing 30. As can be seen in FIGS. 1 and 5-7, the connection hole 311 has a hollow space adjacent to the circuit board bottom side 11 for engaging with an engaging stud of a building block.

According to another embodiment, the method to assemble the circuit board 10 to the outer housing 30 is not limited to the rotational method to fix the circuit board 10 inside the outer housing 30 mentioned above. It can also directly press and fit the first connection portions 13 into the corresponding second connection portions 313 to fix the circuit board 10 to the outer housing 30.

Figure 5:
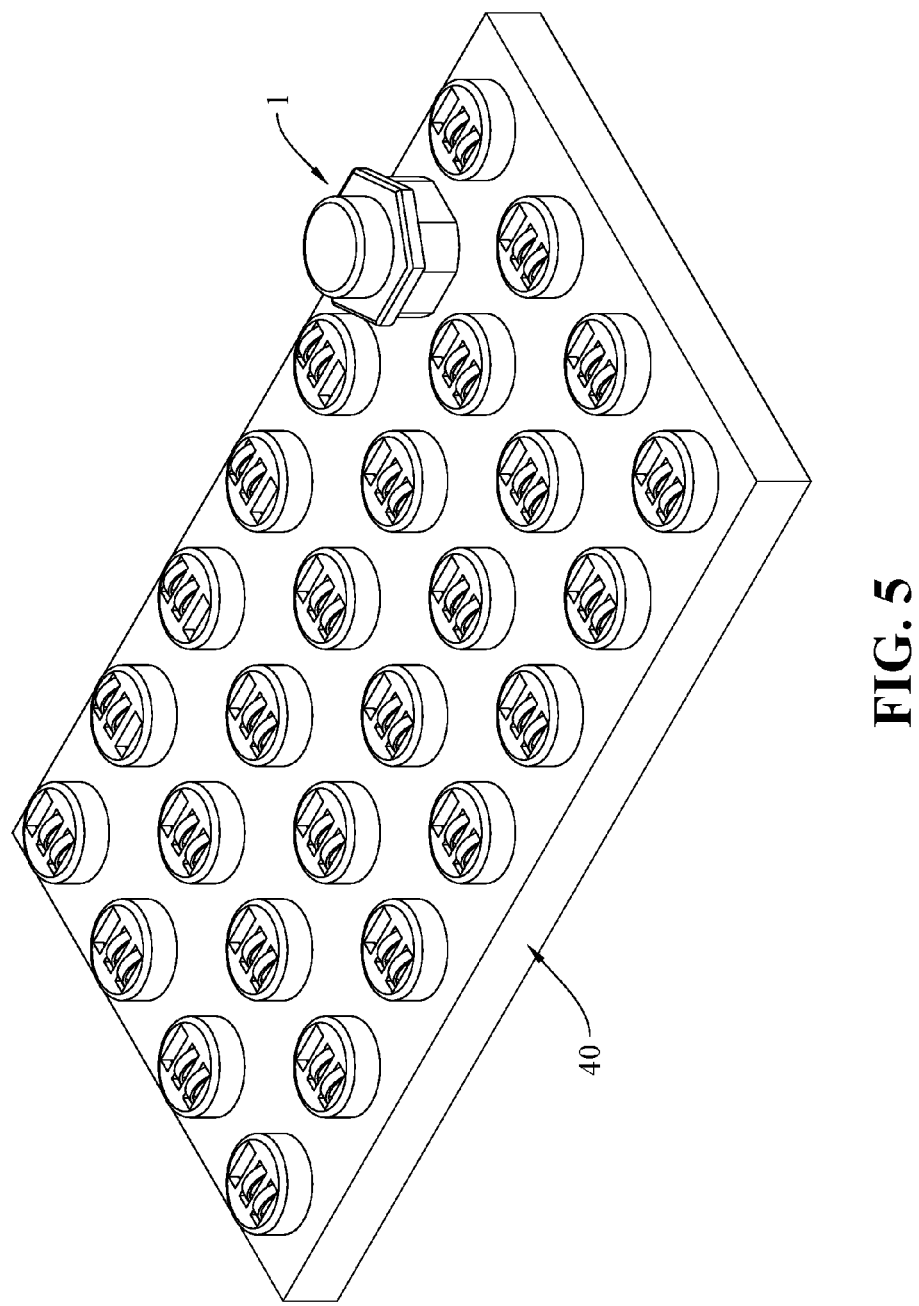
FIG. 5 is a perspective view showing the combined type single stud illuminating building block according to the first preferred embodiment of the present invention engaged with a conductive base.
Figure 6:
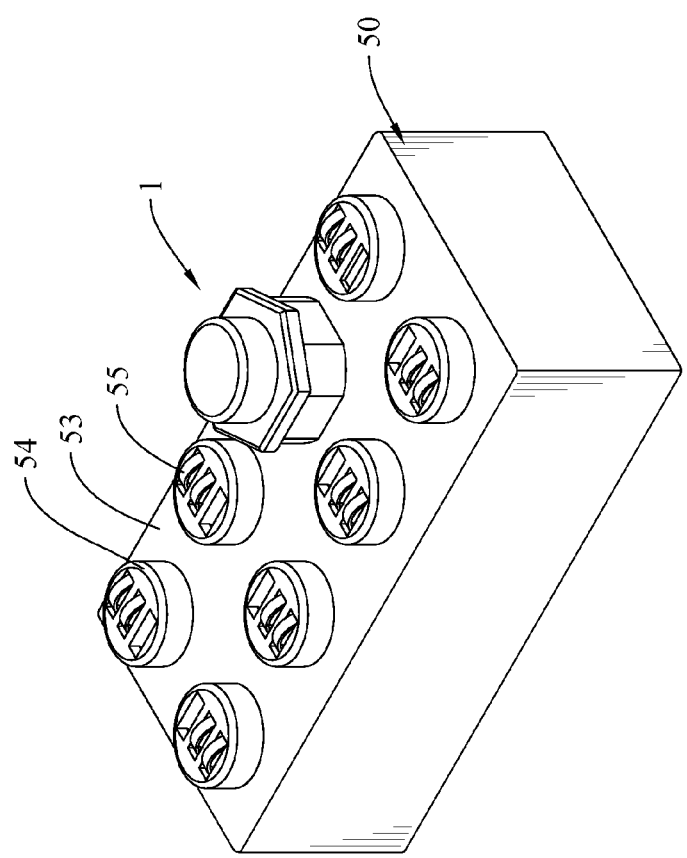
FIG. 6 is a perspective view showing the combined type single stud illuminating building block according to the first preferred embodiment of the present invention engaged with an illuminating building block.
Figure 7:
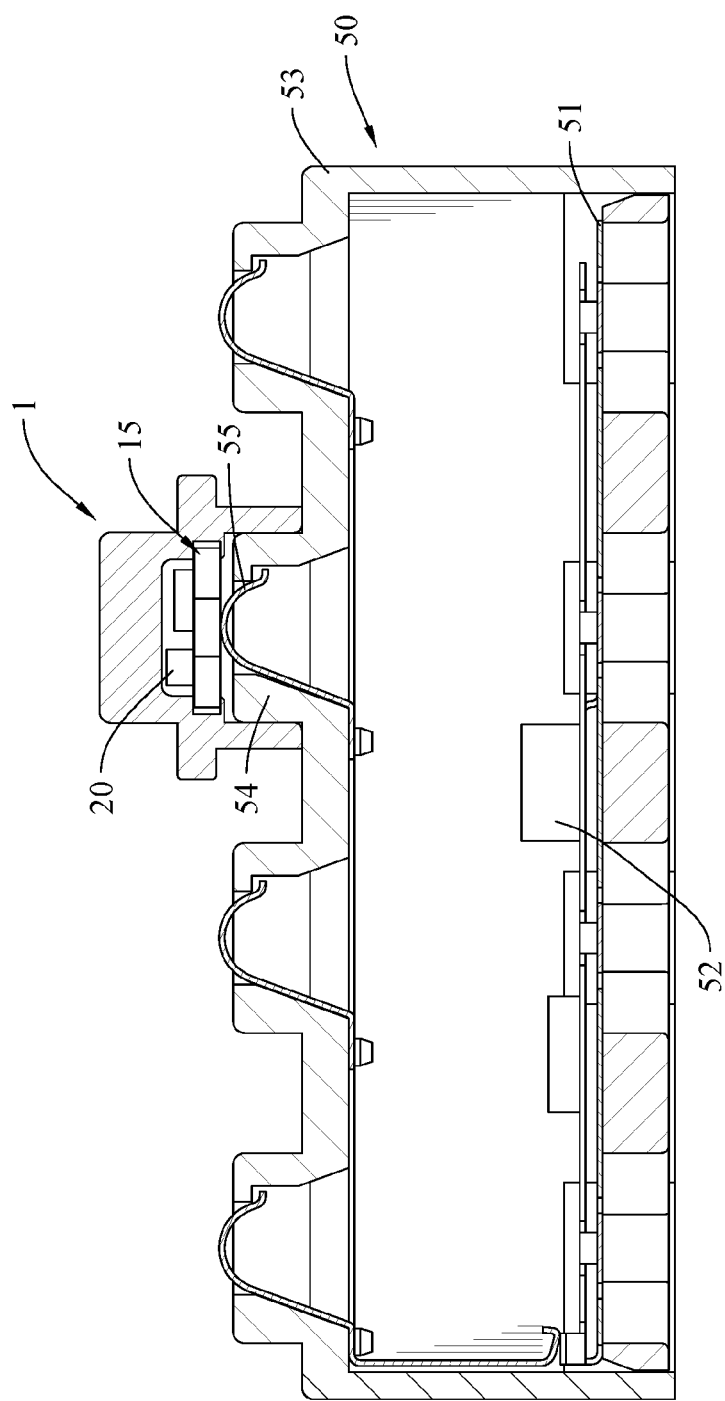
FIG. 7 is a cross sectional side view showing the combined type single stud illuminating building block according to the first preferred embodiment of the present invention engaged with the illuminating building block.

Referring to FIGS. 5 to 7, in order to make the combined type single stud illuminating building block 1 according to the present invention to illuminate, it needs to supply the power to the combined type single stud illuminating building block 1, such as putting the combined type single stud illuminating building block 1 on a conductive base 40 of an illuminating building block 50 or the illuminating building block 50.

The conductive base 40 is connected with an exterior power supply device (not shown in the drawings) to provide the power supplied by the exterior power supply device to the illuminating building block 50. Alternatively, the building block 50 includes an independent power source, such as a battery, to provide the power to the combined type single stud illuminating building block 1. In this way, both of the combined type single stud illuminating building block 1 and the connected combined type single stud illuminating building block 1 and illuminating building block 50 can illuminate.

The illuminating building block 50 includes a circuit board 51, an illuminating member 52, an outer housing 53, eight engaging studs 54 and sixteen elastic pieces 55.

The illuminating member 52 is mounted on the circuit board 51. The power is supplied to the illuminating member 52 from the conductive base 40 to make the illuminating member 52 illuminate. The outer house 53 is made of a light transmittable material and configured to have the circuit board 51 and the illuminating member 52 received therein. The engaging studs 54 are evenly spaced and projected from the outer housing 53 for connecting with another illuminating building block 50 or the combined type single stud illuminating building block 1. At least two elastic pieces 55 are projected out of each of the engaging studs 54 to transmit the power to another illuminating building block 50 or the combined type single stud illuminating building block 1.

With reference to FIGS. 1 to 7, the connection hole 311 of the combined type single stud illuminating building block 1 is engaged with one of the engaging studs 54 of the illuminating building block 50. The two elastic pieces 55 of the engaging stud 54 are contacted with the electrode circuit 15 of the combined type single stud illuminating building block 1. The electrode circuit 15 then transmits the power to the illuminating member 20 of the combined type single stud illuminating building block 1 to make the illuminating member 20 illuminate.

Figure 8:
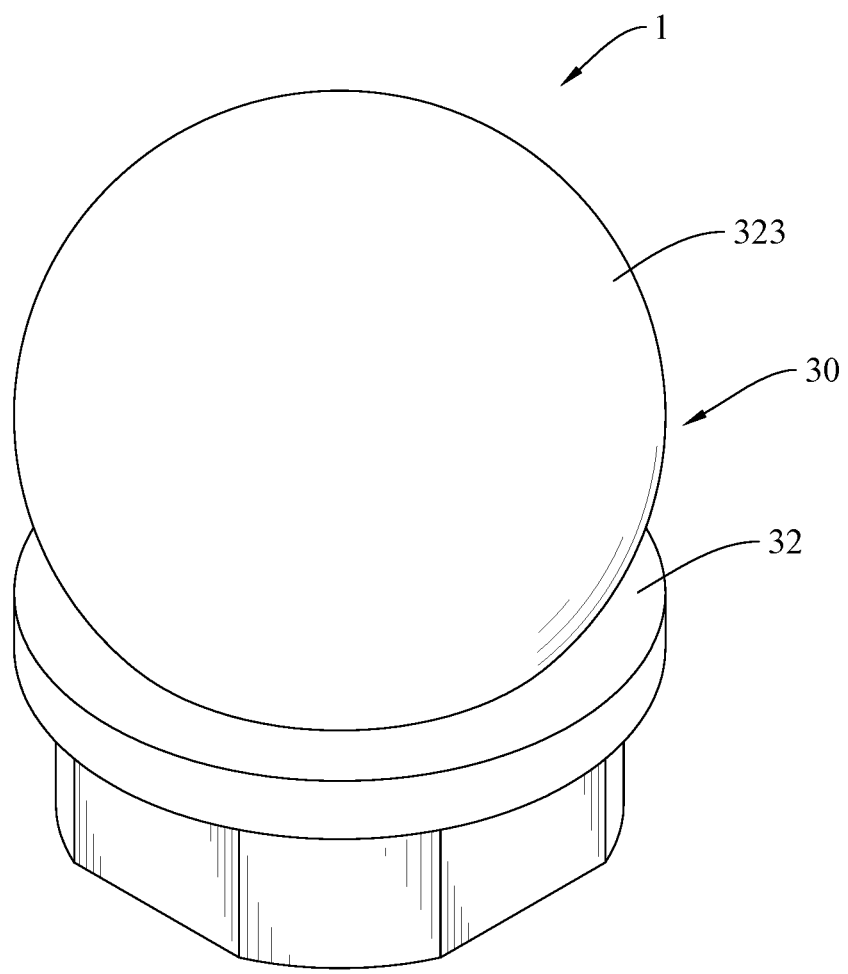
FIG. 8 is a perspective view showing a combined type single stud illuminating building block according to a second preferred embodiment of the present invention.
Figure 9:
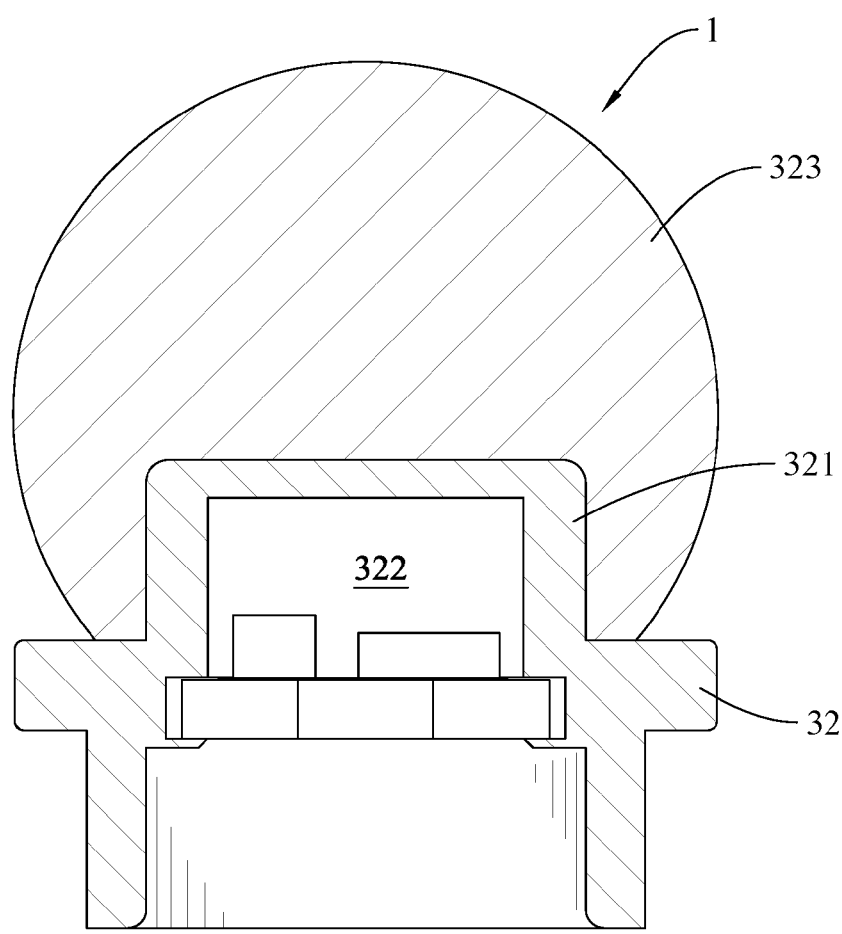
FIG. 9 is a cross sectional side view showing the combined type single stud illuminating building block according to the second preferred embodiment of the present invention.

Moreover, referring to FIGS. 8 and 9, a second preferred embodiment of the present invention is similar to the first preferred embodiment. The differences between the first preferred embodiment and the second preferred embodiment are the circumferential flange 32 is shaped in a circle and the outer housing 30 further includes a decoration portion 323. The decoration portion 323 is disposed on the engaging stud 321 and is a light transmittable sphere, which can enhance the artistic value of the appearance of the combined type single stud illuminating building block 1.

Figure 10:
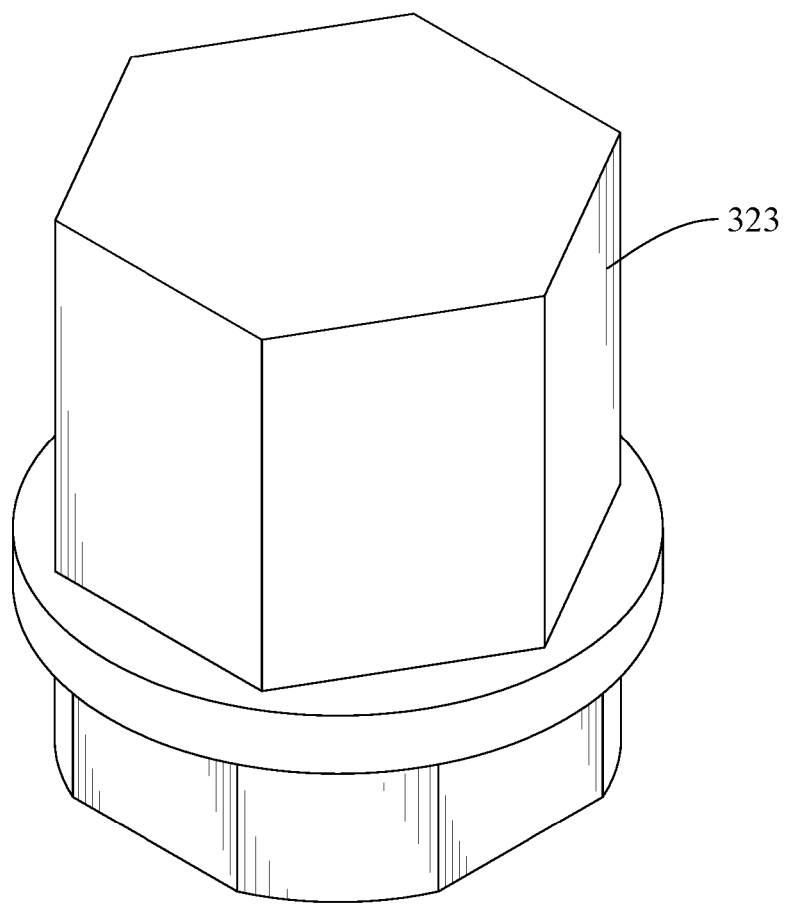
FIG. 10 a perspective view showing a combined type single stud illuminating building block according to a third preferred embodiment of the present invention.

Referring to FIG. 10, a third preferred embodiment of the present invention is similar to the second preferred embodiment. The difference between the second preferred embodiment and the third preferred embodiment is the decoration portion 323 is a light transmittable hexagonal prism. According to another embodiment, the decoration portion 323 can be shaped in any shape.

In summary, the combined type single stud illuminating building block 1 according to the present invention can connect with the conductive base 40 or the illuminating building block 50 to achieve the effect of illumination. Furthermore, the combined type single stud illuminating building block 1 has only one connection hole 311, and therefore it can be connected with the illuminating building block 50 having various numbers of engaging studs 54. Thus, the combined type single stud illuminating building block 1 according to the present invention has more degrees of freedom and diversity of connection of the illuminating building blocks. Moreover, due to the first connection portions 13 and the second connection portions 313, the structures of the bases of the conventional building blocks are simplified. And, the variability and fun during playing the building blocks are enhanced by changing the shapes of the circumferential flange 32 and the decoration portion 323.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A combined type single stud illuminating building block, comprising:
   a circuit board having a circuit board top side and a circuit board bottom side opposite to the circuit board top side, the circuit board including at least one first connection portion, the circuit board bottom side including an electrode circuit disposed thereon;
   an illuminating member mounted on the circuit board top side and electrically connected with the electrode circuit; and
   an outer housing including a connection hole, the circuit board and the illuminating member being received in the connection hole, the outer housing being hollow and light transmittable, the outer housing including at least one second connection portion connected with the at least one first connection portion,
   wherein the connection hole has a hollow space adjacent to the circuit board bottom side for engaging with a building block, the outer housing includes an engaging stud, the engaging stud is located on the outer housing and extended in a direction away from the illuminating member, the engaging stud is hollow and light transmittable, the engaging stud is formed with an emitting space, and the illuminating member is projected into the emitting space.

2. The illuminating building block according to claim 1, wherein the outer housing includes a cylindrical casing member and a circumferential flange, the cylindrical casing member is formed with the connection hole, the at least one second connection portion is disposed in the cylindrical casing member, the circumferential flange is disposed on the cylindrical casing member, and the engaging stud is extended from the circumferential flange in a direction away from the illuminating member.

3. The illuminating building block according to claim 1, wherein the outer housing includes a decoration portion, the decoration portion is disposed on the engaging stud, and the decoration portion is light transmittable.

4. The illuminating building block according to claim 1, wherein the at least one first connection portion includes a plurality of first connection portions, the at least one second connection portion includes a plurality of second connection portions, and the first connection portions are connected with the second connection portions, respectively.

5. The illuminating building block according to claim 1, wherein a periphery of the circuit board is projected outwards to form the at least one first connection portion, each first connection portion is a fitting fixation portion, an interior wall of the outer housing facing the connection hole is formed with the at least one second connection portion and at least one placement groove having a number corresponding to that of the second connection portion, each second connection portion is a fitting fixation groove, each second connection portion communicates with the adjacent placement groove, respectively.

6. The illuminating building block according to claim 1, wherein a periphery of the circuit board is symmetrically projected outwards to form the at least one first connection portion, each first connection portion is a fitting fixation portion, an interior wall of the outer housing facing the connection hole is symmetrically formed with the at least one second connection portion and at least one placement groove having a number corresponding to that of the second connection portion, each second connection portion is a fitting fixation groove, each second connection portion communicates with the adjacent placement groove, respectively, and the at least one second connection portion and the at least one placement groove are alternately arranged.

7. The illuminating building block according to claim 1, wherein each second connection portion is a fitting fixation groove, each second connection portion includes a blocking piece disposed therein, each first connection portion is a fitting fixation portion, and the at least one first connection portion is abut against the at least one blocking piece, respectively.

* * * * *